(12) United States Patent
Lee et al.

(10) Patent No.: US 7,646,011 B2
(45) Date of Patent: Jan. 12, 2010

(54) ORGANIC LIGHT EMITTING DISPLAY DEVICE

(75) Inventors: Jun-Yeob Lee, Suwon-si (KR); Min-Seung Chun, Suwon-si (KR); Yong-Joong Choi, Suwon-si (KR)

(73) Assignee: Samsung Mobile Display Co., Ltd., Suwon-Si, Gyeonggi-do (KR)

( * ) Notice: Subject to any disclaimer, the term of this patent is extended or adjusted under 35 U.S.C. 154(b) by 469 days.

(21) Appl. No.: 11/486,647

(22) Filed: Jul. 14, 2006

(65) Prior Publication Data

US 2007/0012915 A1    Jan. 18, 2007

(30) Foreign Application Priority Data

Jul. 15, 2005    (KR) .................. 10-2005-0064354

(51) Int. Cl.
*H01L 27/15* (2006.01)
*H01L 29/26* (2006.01)
*H01L 31/12* (2006.01)
*H01L 33/00* (2006.01)

(52) U.S. Cl. .......... 257/40; 257/E51.043; 257/E51.044; 257/E51.051; 428/690; 438/99; 438/149

(58) Field of Classification Search .................... 257/13, 257/40, 79–103, E51.043, E51.044, E51.051; 428/690; 438/99, 149

See application file for complete search history.

(56) References Cited

U.S. PATENT DOCUMENTS 5,935,721 A    8/1999    Shi et al.

(Continued)

FOREIGN PATENT DOCUMENTS

JP    06-033047    2/1994

(Continued)

OTHER PUBLICATIONS

Kretsch et al. "Optical gain spectra from doped polymeric waveguides". 2000, Elsevier Schince S.A.*

(Continued)

*Primary Examiner*—M. Wilczewski
*Assistant Examiner*—Telly D Green
(74) *Attorney, Agent, or Firm*—Knobbe Martens Olson & Bear LLP (57) ABSTRACT

An organic light emitting display device is disclosed. The device includes a substrate; a first electrode formed on the substrate; an organic layer including at least an emission layer and formed on the first electrode; and a second electrode formed on the organic layer. The emission layer includes a host and a dopant material. The dopant is one of materials having the structure of Formula 1, Formula 1

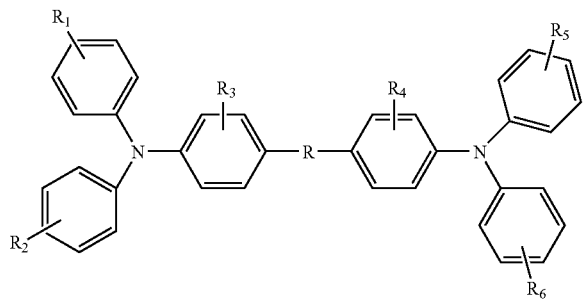

where R may be one selected from the group consisting of ethylene, an ethylene derivative, stilbene, a stilbene derivative. Also, R1 to R6 may be different from or equal to each other, and each is selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group.

18 Claims, 3 Drawing Sheets

U.S. PATENT DOCUMENTS

| | | |
|---|---|---|
| 6,875,524 B2 | 4/2005 | Hatwar et al. |
| 2003/0118866 A1* | 6/2003 | Oh et al. .................... 428/690 |
| 2005/0058853 A1 | 3/2005 | Cosimbescu et al. |
| 2005/0095454 A1 | 5/2005 | Ko et al. |
| 2005/0181232 A1* | 8/2005 | Ricks et al. ................. 428/690 |

FOREIGN PATENT DOCUMENTS

| | | |
|---|---|---|
| KR | 10-2003-0071557 A | 9/2003 |
| WO | WO 2005/042667 A1 | 5/2005 |

OTHER PUBLICATIONS

Kretsch et al. "Distributed feedback laser action from polymeric waveguides doped with oligo phenylene vinylene model compounds" Apr. 17, 2000, American Institute of Physics, vol. 76 No. 16, pp. 2149-2151.*

Fu et al. "Red Fluorescent materials based on naphthylamine for non-doping OLEDs", Mar. 27, 2006, Science Direct, Optical Materials 26 (2006), pp. 348-354, www.sciencedirect.com.*

Pfeiffer et al., "Vinylene-bridged Triphenylamine Dimers as an Emitting Material in Trilayer Organic Electroluminescent Devices"; Jul. 1998; pp. 258-266; SPIE vol. 3476.

Summons to attend oral proceedings pursuant to Rule 115(1) EPC in counterpart EP application No. 06117203.7; Dec. 13, 2007; 6 pages.

Notice of Allowance issued on Sep. 28, 2007 in counterpart Korean patent application No. 10-2005-0064354 in 2 pages.

\* cited by examiner

ORGANIC LIGHT EMITTING DISPLAY DEVICE

CROSS-REFERENCE TO RELATED APPLICATIONS

This application claims priority to and the benefit of Korean Patent Application No. 10-2005-0064354, filed on Jul. 15, 2005, the disclosure of which is incorporated herein by reference in its entirety.

BACKGROUND OF THE INVENTION

1. Field

The present invention relates to an organic light emitting display device (OLED) and, more particularly, to an OLED including a green emission layer whose life span is improved.

2. Description of the Related Technology

An OLED includes an anode, a cathode, and an organic layer including an emission layer disposed between the anode and the cathode. The OLED is an emissive display which applies a voltage to the two electrodes so as to supply holes and electrons into the emission layer, and emits light by recombination of the holes and electrons supplied to the emission layer. Accordingly, the OLED does not need a backlight like an LCD, and thus can be made light and thin. Also, the OLED has attracted attention as a next generation display because it has low-voltage drivability, high luminous efficiency, wide viewing angle, and fast response speed, thereby realizing a high-quality moving picture. Such an OLED can realize full-color by forming a plurality of sub-pixels therein including red, green and blue emission layers. The emission layer may be formed of only a host material or a dopant. However, this configuration is not preferable because efficiency and brightness of the emission layer are very low, and an excimer property and the original property simultaneously occur owing to a self-packing phenomenon between molecules. Thus, the emission layer may be formed by doping a host material with a dopant.

As for a green emission material, the host material may be tri(8-hydroxyquinolinato)aluminum (hereinafter abbreviated as "Alq3") or a stilbene derivative. The organic emission layer may be formed by doping the host material with a quinacridone derivative. In the case of using Alq3, interaction between molecules is so great that it causes cohesion between the molecules, thereby decreasing stability of the device. In the case of using the stilbene derivative, its efficiency is excellent but its thermal stability and thin film property are not, which again decreases the stability of the device. As a result, the device may have a short lifespan.

SUMMARY

One aspect of the invention provides an organic light emitting display device (OLED), comprising: a first electrode; a second electrode; and a light-emitting layer interposed between the first and second electrodes, the light-emitting layer comprising a host and a dopant, the dopant comprising a compound represented by Formula 1:

Formula 1 wherein R is one selected from the group consisting of ethylene, an ethylene derivative, stilbene and a stilbene derivative; wherein R1 to R6 are different from or equal to one another, and each of R1 to R6 is selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group.

The dopant may comprise a compound represented by Formula 2:

Formula 2

The host may comprise a compound represented by Formula 3:

Formula 3 wherein R is one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group, and wherein X is one selected from the group consisting of a naphthyl group, a biphenyl group, phenylnaphthalene, phenylanthracene and their derivatives.

The host may comprise binaphthyl methylanthracene. The dopant may be in an amount from about 1 wt % to about 20 wt % with reference to the total weight of the host and the dopant. The OLED may further comprise at least one layer selected from the group consisting of a hole injection layer, a hole transport layer, an electron transport layer and an electron injection layer, the at least one layer being interposed between the first and second electrodes. The light-emitting layer may be a green light emitting layer.

Another aspect of the invention provides an electronic device comprising the OLED described above.

Yet another aspect of the invention provides an organic light emitting display device (OLED), comprising: a substrate; and an array of pixels formed over the substrate, each of the pixels comprising sub-pixels configured to emit light of different colors, at least one of the sub-pixels comprising a light-emitting layer which comprises a host and a dopant, the dopant comprising a compound represented by Formula 1:

Formula 1 wherein R is one selected from the group consisting of ethylene, an ethylene derivative, stilbene and a stilbene derivative; wherein R1 to R6 are different from or equal to one another, and each of R1 to R6 is selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group.

Another of the sub-pixels may comprise a light-emitting layer which comprises a host and a dopant, the dopant comprising a red light-emitting material. Another of the sub-pixels may comprise a light-emitting layer which comprises a host and a dopant, the dopant comprising a blue light-emitting material. The compound represented by Formula 1 may comprise a compound represented by Formula 2:

Formula 2

The host may comprise a compound represented by Formula 3:

Formula 3 wherein R is one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group, and wherein X is one selected from the group consisting of a naphthyl group, a biphenyl group, phenylnaphthalene, phenylanthracene and their derivatives.

The compound represented by Formula 3 may comprise binaphthyl methylanthracene. The dopant may be in an amount from about 1 wt % to about 20 wt % with reference to the total weight of the host and the dopant. Each of the sub-pixels may further comprise a first electrode and a second electrode such that the light-emitting layer is interposed therebetween, and the second electrodes of the sub-pixels may be electrically connected to one another. At least one of the sub-pixels may further comprise a hole injection layer and/or a hole transport layer between the first electrode and the light-emitting layer. At least one of the sub-pixels may further comprise an electron transport layer and/or an electron injection layer between the second electrode and the light-emitting layer.

Another aspect of the invention provides a method of making an organic light emitting display device. The method comprises: forming a first electrode over a substrate; forming an organic layer over the substrate, the organic layer comprising a host; doping the organic layer with a dopant; and forming a second electrode over the organic layer, wherein the dopant comprises a compound represented by Formula 1:

Formula 1 wherein R is one selected from the group consisting of ethylene, an ethylene derivative, stilbene and a stilbene derivative; wherein R1 to R6 are different from or equal to one another, and each of R1 to R6 is selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group.

In the method, the dopant may be in an amount from about 1 wt % to about 20 wt % with reference to the total weight of the host and the dopant.

BRIEF DESCRIPTION OF THE DRAWINGS

The above and other features of the invention will be described in reference to certain exemplary embodiments thereof with reference to the attached drawings in which.

DETAILED DESCRIPTION

The present embodiment will now be described more fully hereinafter with reference to the accompanying drawings, in which exemplary embodiments of the invention are shown.

Figure 1:
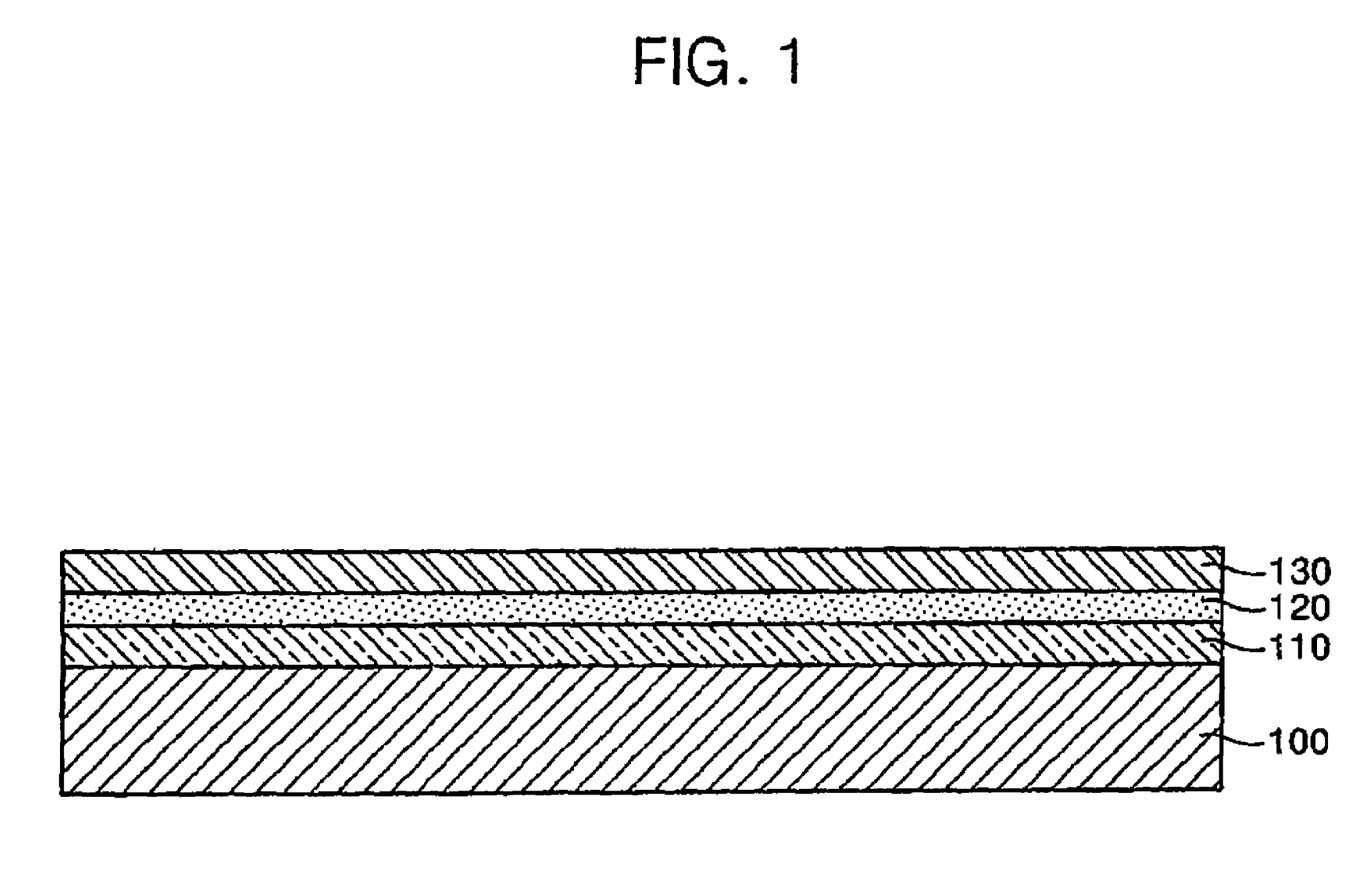
FIG. 1 is a cross-sectional view of an organic light emitting display device (OLED) according to a first exemplary embodiment.

FIG. 1 is a cross-sectional view of an organic light emitting display device (OLED) according to a first exemplary embodiment. Referring to FIG. 1, a substrate 100 is disposed. The substrate 100 is an insulating or conductive substrate, which includes glass, plastic or metal. In this exemplary embodiment, the substrate 100 includes, but is not limited to, these materials.

A first electrode 110 is formed on the substrate 100. The first electrode 110 may be an anode or a cathode. When the first electrode 110 is an anode, the first electrode 110 may be a transparent electrode including either ITO or IZO. Alternatively, the first electrode 110 may be a reflective electrode including either Pt, Cr, Ag, Ni, Al or an alloy thereof. On the other hand, when the first electrode 110 is a cathode, the first electrode 110 may be a thin transparent electrode or a thick reflective electrode which includes one selected from the group consisting of Mg, Ca, Al, Ag, Ba, and an alloy thereof. The first electrode 110 may be formed by vacuum deposition but is not limited thereto.

An emission layer 120 is formed on the first electrode 110. The emission layer 120 may include a host and a dopant, which can improve luminous efficiency by energy transition.

In one embodiment, the dopant may be a green dopant. The green dopant may be a material represented by Formula 1, Formula 1

In Formula 1, R may be one selected from the group consisting of ethylene, an ethylene derivative, stilbene and a stilbene derivative. Also, R1 to R6 may be different from or the same as each other, and each may be one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group.

The dopant material represented by Formula 1 is a material having a small energy difference between a highest occupied molecular orbital (HOMO) and a lowest unoccupied molecular orbital (LUMO), and can effectively deliver energy to a host which will be described later, thereby improving luminous efficiency.

In one embodiment, the green dopant may include a compound represented by Formula 2.

Formula 2

The host may include one of naphthylanthracene derivatives represented by Formula 3.

Formula 3

In Formula 3, R may be one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group. X may be one selected from the group consisting of a naphthyl radical, a biphenyl radical, phenylnaphthalene, phenylanthracene and their derivatives.

The naphthylanthracene derivatives of Formula 3 can reduce interaction between molecules so as to prevent cohesion of the molecules, and have superior thermal stability and thin film property. In addition, the derivatives can prevent crystallization, thereby increasing the lifespan of the device. Furthermore, charges injected into an emission layer are bound in the emission layer, thereby more improving the stability of the device. In one embodiment, the host may be binaphthyl methylanthracene. In one embodiment, the host material may be doped to have a dopant concentration of about 1 to about 20%.

When the emission layer 120 is formed by doping the green dopant represented by Formula 1 into the naphthylanthracene derivative, the resulting OLED is less crystallized, has improved lifespan, and has superior thermal stability and luminous efficiency.

The emission layer 120 may be formed by any suitable fabrication method. For example, the emission layer may be formed by one of vacuum deposition, spin coating and laser induced thermal imaging.

A second electrode 130 is formed on the emission layer 120. The second electrode 130 may be a cathode when the first electrode 110 is an anode. Here, the second electrode 130 may be a conductive metal having a lower work function than the material for the first electrode 110. For example, the second electrode 130 may be a thick reflective electrode which includes one material selected from the group consisting of Mg, Ca, Al, Ag and an alloy thereof.

On the other hand, when the first electrode 110 is a cathode, the second electrode 130 may be a metal having a higher work function than the material for the first electrode 110. The second electrode may be a transparent electrode including ITO or IZO, or a reflective electrode including Pt, Au, Ir, Cr, Mg, Ag, Ni, Al or an alloy thereof.

Subsequently, the OLED may be finished by encapsulating the substrate including the first electrode, the emission layer, and the second electrode with an encapsulation substrate.

Figure 2:
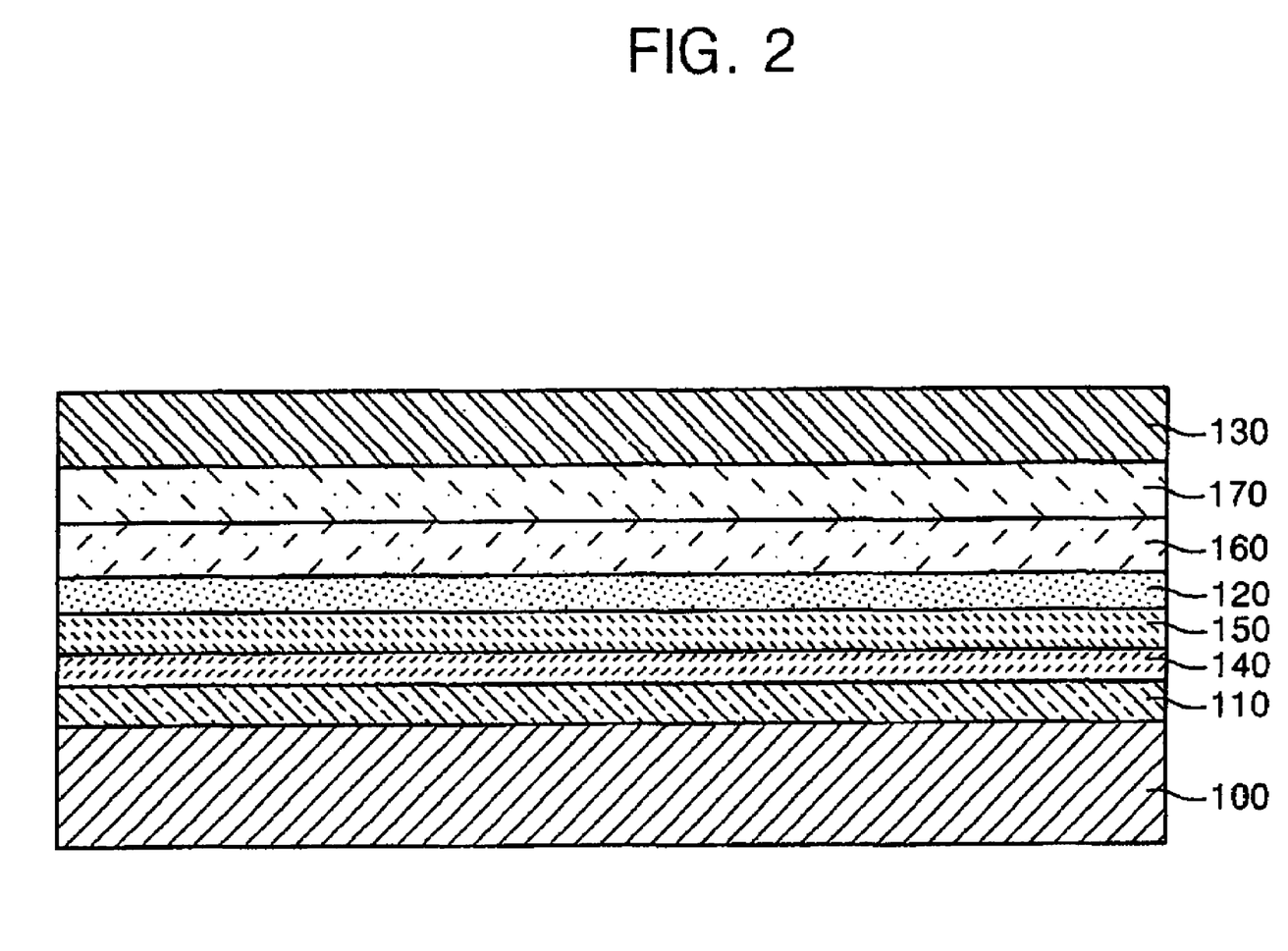
FIG. 2 is a cross-sectional view of an OLED according to a second exemplary embodiment.

FIG. 2 is a cross-sectional view of an OLED according to a second exemplary embodiment. The second exemplary embodiment has the same structure and reference numerals as the first exemplary embodiment, except that the second exemplary embodiment further includes at least one organic layer in addition to an emission layer, and thus the detailed description thereof will be omitted.

Referring to FIG. 2, a first electrode 110 is formed on a substrate 100. A second electrode 130 is formed over the first electrode 100 with at least one organic layer interposed therebetween. The first electrode 110 may be an anode, and the second electrode 130 may be a cathode.

In the illustrated embodiment, a hole injection layer 140 may be formed on the first electrode 110. The hole injection layer 140 may be formed of a material having low ionization energy and high interfacial adhesive strength with the first electrode 110 to facilitate the injection of holes and to increase lifespan of the device. The hole injection layer 140 may include one or more of an aryl amine-based compound, a phophyrine-based metal complex, starburst amines and so on. In one embodiment, the hole injection layer 140 may include one or more of 4,4',4''-tris(3-methylpheny-phenylamino)triphenylamine (m-MTDATA), 4,4',4''-tris(N,N-diphenylamino)triphenylamine (TDATA), and copper phtharocyanine (CuPc).

A hole transport layer 150 may be formed on the hole injection layer 140. The hole transport layer 150 serves to easily convey holes to an emission layer 120 which will be described later, and inhibit electrons generated from the second electrode 130 from moving to an emission region, thereby increasing luminous efficiency. The hole transport layer 150 may be formed of an arylene diamine derivative, a starburst compound a biphenyl diamine derivative having a spiro group and a ladder compound. In one embodiment, the hole transport layer 150 may be formed of N,N-diphenyl-N,N'-bis(4-methylphernyl)-1,1'-biphenyl-4,4'-diamine (TPD) or 4,4'-bis[N-(1-naphthyl)-N-phenyl-amino]biphenyl (NPB).

The emission layer 120 may be formed on the hole transport layer 150 as described in the first exemplary embodiment.

An electron transport layer 160 may be formed on the emission layer 120. The electron transport layer 160 may include a metal compound such that the emission layer 120 can accept electrons. For example, Alq3 can stably transport electrons supplied from the second electrode 130.

An electron injection layer 170 may be formed on the electron transport layer 160. The electron injection layer 170 may be formed of at least one selected from the group consisting of a 1,3,4-oxydiazol derivative, a 1,2,4-triazol derivative and LiF. Such an organic layer may be formed by any suitable method including, but not limited to, spin coating or vacuum deposition.

Subsequently, as in the first exemplary embodiment, the second electrode 130 is formed on the electron injection layer 170.

In this embodiment, the first electrode is an anode. In certain embodiments where the first electrode is a cathode, an electron injection layer, an electron transport layer, an emission layer, a hole transport layer and a hole injection layer may be sequentially formed on the first electrode.

In FIG. 2, the electron injection layer, the electron transport layer, the hole transport layer and the hole injection layer in addition to the emission layer are formed. A skilled artisan will appreciate that at least one of the organic layers may be omitted.

Figure 3:
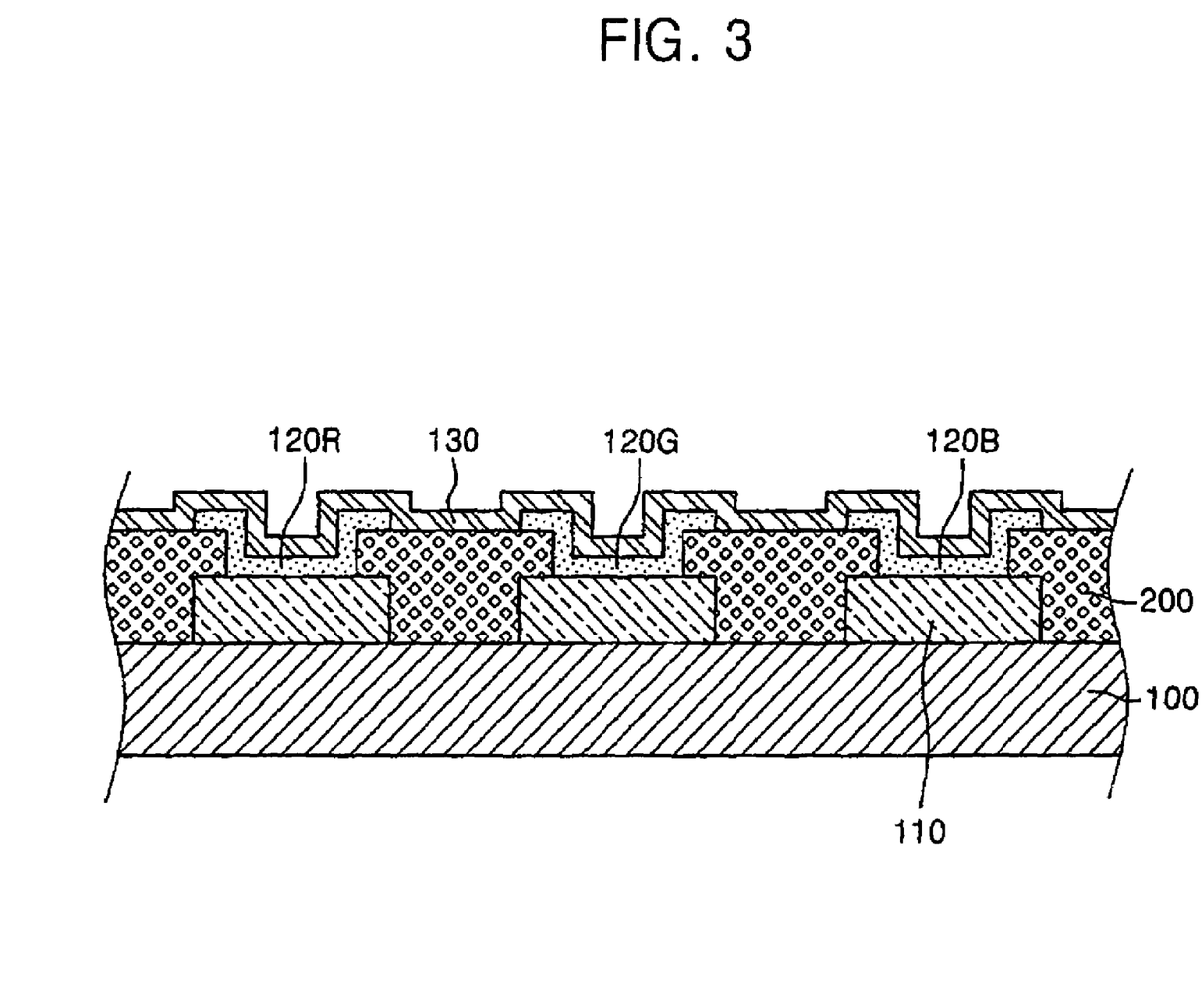
FIG. 3 is a cross-sectional view of a full-color OLED according to a third exemplary embodiment.

FIG. 3 is a cross-sectional view of a full-color OLED according to a third exemplary embodiment. In the illustrated embodiment, the full-color OLED is formed with red, blue and green emission regions, wherein the green emission layer is the green emission layer of the first exemplary embodiment. Here, parts that are the same as in the first exemplary embodiment are denoted by the same reference numerals and their descriptions will not be repeated.

Referring to FIG. 3, a substrate 100 is disposed. A first electrode 110 patterned for each unit pixel is disposed on the substrate 100. As described above, the first electrode 110 may be an anode or a cathode. A pixel defining layer 200 defining each unit pixel is formed on the first electrode 110. The pixel defining layer 200 includes an opening exposing a portion of the first electrode 110. Here, the pixel defining layer 200 may include one or more selected from the group consisting of acryl-based resin, benzocyclobutene (BCB) and polyimide (PI).

Red, green and blue emission layers 120R, 120G and 120B are formed on the first electrodes 110 defined by the pixel defining layer 200, respectively. Here, the red and blue emission layers may be formed of a typical material but are not limited thereto.

In one embodiment, the green emission layer 120G may be formed by doping one of materials represented by Formula 1 into the naphthylanthracene derivative as a host material, as described in the first exemplary embodiment.

The red emission layer 120R may include a carbazole-based organic material as a host material. In one embodiment, the carbazole-based material may be carbazole biphenyl. A dopant material for the red emission layer 120R may be a phosphorescent dopant, a fluorescent dopant, or a composite dopant thereof. For example, the phosphorescent dopant may be one or more selected from the group consisting of PIQIr (acac), PQIr (acac), PQIr (tris(1-phenylquinoline)iridium) and platinum octaethylporphine (PtOEP). Also, the fluorescent dopant may be one or more selected from the group consisting of 4-dicyanomethylene-6-cp-julolidinostyryl-2-tert-butyl-4H-pyran (DCJTB), 3-dicyanomethylene)-5,5-dimethyl-1-(4-N,N-dimethyl amino-styryl)-cyclohexene (DCDDC), AAAP, diketopyrrolopyrroles (DPP) and BSN. In other embodiments, any suitable red emission material may be used for the red emission layer 120R.

The blue emission layer 120B may include one or more compounds selected from the group consisting of 4,4'-bis(2,2'-diphenylvinyl)-biphenyl (DPVBi), spiro-DPVBi, spiro-6P, distilbene (DSB) and distirlyarylene (DSA) as a low molecular material, or a PFO or PPV-based polymer. To increase luminous efficiency, the blue emission layer 120B may be doped with a fluorescent dopant, for example, perylene or 4,4'-(Bis(9-ethyl-3-carbazovinylene)-1,1'-biphenyl (BCzVBi). In other embodiments, any suitable blue emission material may be used for the blue emission layer 120B. Each of the emission layers may be formed by vacuum deposition, spin coating, or laser induced thermal imaging.

Next, a second electrode 130 is formed on each emission layer as a common layer. In addition, at least one layer selected from the group consisting of a hole injection layer, a hole transport layer, a hole blocking layer, an electron transport layer and an electron injection layer may be formed on or under each emission layer.

Hereinafter, Examples will be described. However, the embodiment is not limited to these Examples.

EXAMPLE 1

A Corning™ 15 Ω/cm$^2$ (1200 Å) ITO glass substrate was cut to dimensions of 50 mm×50 mm×0.7 mm, ultrasonically cleaned in isopropyl alcohol and pure water for 5 minutes, cleaned using UV rays and ozone for 30 minutes, and used as an anode.

N,N'-di(1-naphthyl)-N,N'-diphenylbenzidine (NPD) was vacuum-deposited on the substrate to thereby form a hole transport layer having a thickness of 600 Å. The compound of Formula 2 was vacuum-deposited to a concentration of 5%, and an emission layer was formed to have a thickness of about 400 Å on the hole transport layer using binaphthyl-(methylanthracene) (available from E-ray Company) as a host. An electron transport material, Alq3, was deposited on the emission layer thereby forming an electron transport layer of about 300 Å. An LiF/Al electrode was formed by sequentially vacuum-depositing an LiF 10 Å electron injection layer and an Al 1000 Å cathode on the electron transport layer, and thus an OLED was completed.

The device exhibited a driven lifespan of 4000 hours at a luminous efficiency of 18 cd/A and a luminance of 5000 cd/m$^2$.

COMPARATIVE EXAMPLE 1

A Corning™ 15 Ω/cm$^2$ (1200 Å) ITO glass substrate was cut to dimensions of 50 mm×50 mm×0.7 mm, ultrasonically cleaned in isopropyl alcohol and pure water for 5 minutes, cleaned using UV rays and ozone for 30 minutes, and used as an anode.

N,N'-di(1-naphthyl)-N,N'-diphenylbenzidine (NPD) was vacuum-deposited on the substrate to thereby form a hole transport layer having a thickness of 600 Å. A C545T compound (available from Hayashibara Company) was vacuum-deposited to a concentration of 1%, and an emission layer was formed to have a thickness of about 400 Å on the hole transport layer using binaphthyl-(methylanthracene) (available from E-ray Company) as a host. An electron transport material, Alq3, was deposited on the emission layer thereby forming an electron transport layer of about 300 Å. An LiF/Al electrode was formed by sequentially vacuum-depositing an LiF 10 Å electron injection layer and an Al 1000 Å cathode on the electron transport layer, and thus an OLED was completed. The device exhibited a driven lifespan of 1500 hours at a luminous efficiency of 12 cd/A and a luminance of 5000 cd/m$^2$.

As a result, the green OLED having excellent luminous efficiency and improved lifespan could be fabricated.

According to the embodiments, an emission layer is formed using a dopant including a material represented by Formula 1 and a host having a naphthylanthracene derivative, thereby fabricating a green OLED having excellent luminous efficiency and improved lifespan.

While it is described with reference to exemplary embodiments, it will be understood by those of ordinary skill in the art that various changes in form and details may be made without departing from the spirit and scope of the invention as set forth in the following claims.

What is claimed is:

1. An organic light emitting display device (OLED), comprising:
   a first electrode;
   a second electrode; and
   a light-emitting layer interposed between the first and second electrodes, the light-emitting layer comprising a host and a dopant, the dopant comprising a compound represented by Formula 2:

Formula 2

2. The OLED of claim 1, wherein the dopant comprises a compound represented by Formula 3:

Formula 3 wherein R is one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group, and wherein X is one selected from the group consisting of a naphthyl group, a biphenyl group, phenylnaphthalene, phenylanthracene and their derivatives.

3. The OLED of claim 2, wherein the host comprises binaphthyl methylanthracene.

4. The OLED of claim 1, wherein the dopant is in an amount from about 1 wt % to about 20 wt % with reference to the total weight of the host and the dopant.

5. The OLED of claim 1, further comprising at least one layer selected from the group consisting of a hole injection layer, a hole transport layer, an electron transport layer and an electron injection layer, the at least one layer being interposed between the first and second electrodes.

6. The OLED of claim 1, wherein the light-emitting layer is a green light emitting layer.

7. An electronic device comprising the OLED of claim 1.

8. An organic light emitting display device (OLED), comprising:

a substrate; and an array of pixels formed over the substrate, each of the pixels comprising sub-pixels configured to emit light of different colors, at least one of the sub-pixels comprising a light-emitting layer which comprises a host and a dopant, the dopant comprising a compound represented by Formula 2:

Formula 2

9. The OLED of claim 8, wherein another of the sub-pixels comprises a light-emitting layer which comprises a host and a dopant, the dopant comprising a red light-emitting material.

10. The OLED of claim 8, wherein another of the sub-pixels comprises a light-emitting layer which comprises a host and a dopant, the dopant comprising a blue light-emitting material.

11. The OLED of claim 8, wherein the host comprises a compound represented by Formula 3:

Formula 3 wherein R is one selected from the group consisting of a hydrogen atom, a halogen atom, a substituted or unsubstituted $C_1$ to $C_{20}$ alkyl group, a substituted or unsubstituted $C_1$ to $C_{20}$ alkoxy group, a substituted or unsubstituted $C_5$ to $C_{20}$ aryl group, a $C_3$ to $C_{30}$ heterocyclic group, and an aliphatic $C_3$ to $C_{30}$ hydrocarbon group, and wherein X is one selected from the group consisting of a naphthyl group, a biphenyl group, phenylnaphthalene, phenylanthracene and their derivatives.

12. The OLED of claim 11, wherein the compound represented by Formula 3 comprises binaphthyl methylanthracene.

13. The OLED of claim 8, wherein the dopant is in an amount from about 1 wt % to about 20 wt % with reference to the total weight of the host and the dopant.

14. The OLED of claim 8, wherein each of the sub-pixels further comprises a first electrode and a second electrode such that the light-emitting layer is interposed therebetween, and wherein the second electrodes of the sub-pixels are electrically connected to one another.

15. The OLED of claim 14, wherein at least one of the sub-pixels further comprises a hole injection layer and/or a hole transport layer between the first electrode and the light-emitting layer.

16. The OLED of claim 14, wherein at least one of the sub-pixels further comprises an electron transport layer and/or an electron injection layer between the second electrode and the light-emitting layer.

17. A method of making an organic light emitting display device, the method comprising:
forming a first electrode over a substrate;
forming an organic layer over the substrate, the organic layer comprising a host;
doping the organic layer with a dopant; and
forming a second electrode over the organic layer,
wherein the dopant comprises
a compound represented by Formula 2:

Formula 2

18. The method of claim 17, wherein the dopant is in an amount from about 1 wt % to about 20 wt % with reference to the total weight of the host and the dopant.

* * * * *